United States Patent
Zhang et al.

(10) Patent No.: US 10,886,194 B2
(45) Date of Patent: Jan. 5, 2021

(54) RADIATOR COMPONENT AND HEAT DISSIPATION SYSTEM FOR POWER SEMICONDUCTOR DEVICE

(71) Applicant: Siemens Aktiengesellschaft, Munich (DE)

(72) Inventors: Sheng Zhang, Langfang (CN); Ji Long Yao, Beijing (CN); Yan Feng Zhao, Beijing (CN); Lei Shi, Beijing (CN); Ze Wei Liu, Beijing (CN)

(73) Assignee: SIEMENS AKTIENGESELSCHAFT, Munich (DE)

( * ) Notice: Subject to any disclaimer, the term of this patent is extended or adjusted under 35 U.S.C. 154(b) by 0 days.

(21) Appl. No.: 16/647,923

(22) PCT Filed: Jul. 6, 2018

(86) PCT No.: PCT/EP2018/068343
§ 371 (c)(1),
(2) Date: Mar. 17, 2020

(87) PCT Pub. No.: WO2019/063154
PCT Pub. Date: Apr. 4, 2019

(65) Prior Publication Data
US 2020/0266124 A1    Aug. 20, 2020

(30) Foreign Application Priority Data
Sep. 28, 2017   (CN) .......................... 2017 1 0897202

(51) Int. Cl.
*H01L 23/467*     (2006.01)
*H01L 25/065*     (2006.01)

(52) U.S. Cl.
CPC ........ *H01L 23/467* (2013.01); *H01L 25/0655* (2013.01)

(58) Field of Classification Search
CPC .......................... H01L 23/467; H01L 25/0655
See application file for complete search history.

(56) References Cited

U.S. PATENT DOCUMENTS 8,453,715 B2 *   6/2013   Arik ......................... F28F 9/24
                                                        165/80.3
2002/0022303 A1   2/2002   Senba et al.
(Continued)

FOREIGN PATENT DOCUMENTS

| CN | 201209840 Y | 3/2009 |
| CN | 106796928 A | 5/2017 |

(Continued)

OTHER PUBLICATIONS

International Search Report PCT/ISA/210 for International Application No. PCT/EP2018/068343 dated Sep. 12, 2018.
Chinese Office Action dated May 7, 2020.

*Primary Examiner* — Jose R Diaz
(74) *Attorney, Agent, or Firm* — Harness, Dickey & Pierce, P.L.C.

(57) ABSTRACT

Embodiments disclose a radiator component and a heat dissipation system for a power semiconductor device. The radiator component for a power semiconductor device includes a heat dissipation body including an inner-ring substrate, an outer-ring substrate, and a plurality of heat sinks. In an embodiment, the outer-ring substrate surrounds the inner-ring substrate and the plurality of heat sinks are arranged between the inner-ring substrate and the outer-ring substrate. One or more first power semiconductor device arrangement positions are provided on an inner circumferential surface of the inner-ring substrate and one or more second power semiconductor device arrangement positions are arranged on an outer circumferential surface of the outer-ring substrate. The radiator component further includes a fan component. The embodiments can save on (Continued)

space, reduce costs, improve the heat dissipation efficiency, and avoid the problem of disturbances between a plurality of fans.

15 Claims, 4 Drawing Sheets

(56) References Cited

U.S. PATENT DOCUMENTS

| | | | |
|---|---|---|---|
| 2006/0021735 A1* | 2/2006 | Lopatinsky | H01L 23/467 |
| | | | 165/80.3 |
| 2006/0039110 A1* | 2/2006 | Foster, Sr. | F04D 25/166 |
| | | | 361/697 |
| 2009/0091892 A1 | 4/2009 | Otsuka et al. | |
| 2016/0104658 A1* | 4/2016 | Bradfield | H02K 9/04 |
| | | | 310/58 |

FOREIGN PATENT DOCUMENTS

| | | |
|---|---|---|
| CN | 106797162 A | 5/2017 |
| JP | WO2016194052 A1 | 6/2017 |
| WO | WO-2016065485 A1 | 5/2016 |

* cited by examiner

RADIATOR COMPONENT AND HEAT DISSIPATION SYSTEM FOR POWER SEMICONDUCTOR DEVICE

PRIORITY STATEMENT

This application is the national phase under 35 U.S.C. § 371 of PCT International Application No. PCT/EP2018/068343 which has an International filing date of Jul. 6, 2018, which designated the United States of America and which claims priority to Chinese patent application no. CN 201710897202.4 filed Sep. 28, 2017, the entire contents of each of which are hereby incorporated herein by reference.

FIELD

Embodiments of the invention generally relate to the field of power semiconductor technology, and in particular, to a radiator component and a heat dissipation system for a power semiconductor device.

BACKGROUND

Power converters are widely applied in fields such as variable-frequency motor driving, power transmission and transformation, and renewable energy. In these fields, variable-frequency motor driving is one of the most mature applications. A power converter can enable a motor to operate at different working speeds. A power converter usually comprises a power semiconductor device, such as an insulated-gate bipolar transistor (IGBT), a power diode or a metal-oxide semiconductor field-effect transistor (MOS-FET). The power semiconductor device generates considerable heat when working, and excellent heat dissipation is needed to ensure the working performance.

Currently, a specific cooling technology is usually used to implement the heat dissipation of a power semiconductor device. Heat dissipation methods may comprise the natural cooling of a metal radiator, forced air cooling or liquid cooling using a combination of a metal radiator and a fan, and the like. For price-sensitive universal industrial converters, air cooling is the most widely accepted method.

In the prior art, a power semiconductor device is usually arranged on a radiator having a planar substrate. A plurality of fans at an upper portion or a lower portion of a substrate are used to suck air or blow air to carry away heat generated by the power semiconductor device. However, a radiator having a planar arrangement does not have a compact heat dissipation structure and occupies a relatively large space. Moreover, air flow disturbances further exist between a plurality of fans.

In the prior art, a power semiconductor device is usually cooled in a water-cooling method.

FIG. 1 is a schematic structural diagram of a water-cooling heat dissipation system in the prior art. In FIG. 1, a power semiconductor device 30, a power semiconductor device 31, and a power semiconductor device 32 are arranged on a cooling plate 38 comprising an inner chamber 35. Cooling water is sucked, by a pump 36, into the inner chamber 35 of the cooling plate 38 via a cooling water circuit inlet 33. The cooling water absorbs the heat generated by the power semiconductor device 30, the power semiconductor device 31, and the power semiconductor device 32. The temperature of the cooling water is reduced after the cooling water reaches a heat exchanger 37 via a cooling water circuit outlet 34.

SUMMARY

The inventors have recognized that a water-cooling system for cooling a power semiconductor device has a relatively large size and a complex structure.

At least one embodiment of the present invention provides a radiator component and/or a heat dissipation system for a power semiconductor device.

At least one embodiment of the present invention is directed to a radiator component for a power semiconductor device, comprising:
  a heat dissipation body, comprising:
  an inner-ring substrate,
  an outer-ring substrate, wherein the outer-ring substrate surrounds the inner-ring substrate, and
  a plurality of heat sinks, arranged between the inner-ring substrate and the outer-ring substrate, wherein one or more first power semiconductor device arrangement positions are provided on an inner circumferential surface of the inner-ring substrate, and one or more second power semiconductor device arrangement positions are arranged on an outer circumferential surface of the outer-ring substrate; and
  a fan component.

At least one embodiment of the invention is directed to a heat dissipation system for a power semiconductor device, comprising:
  a heat dissipation body, comprising an inner-ring substrate, an outer-ring substrate, and a plurality of heat sinks, wherein the outer-ring substrate surrounds the inner-ring substrate, the plurality of heat sinks are arranged between the inner-ring substrate and the outer-ring substrate, one or more first power semiconductor device arrangement positions are provided on an inner circumferential surface of the inner-ring substrate, and one or more second power semiconductor device arrangement positions are arranged on an outer circumferential surface of the outer-ring substrate;
  a fan component;
  a first power semiconductor device, arranged at at least one first power semiconductor device arrangement position; and
  a second power semiconductor device, arranged at at least one second power semiconductor device arrangement position.

Figure 1:
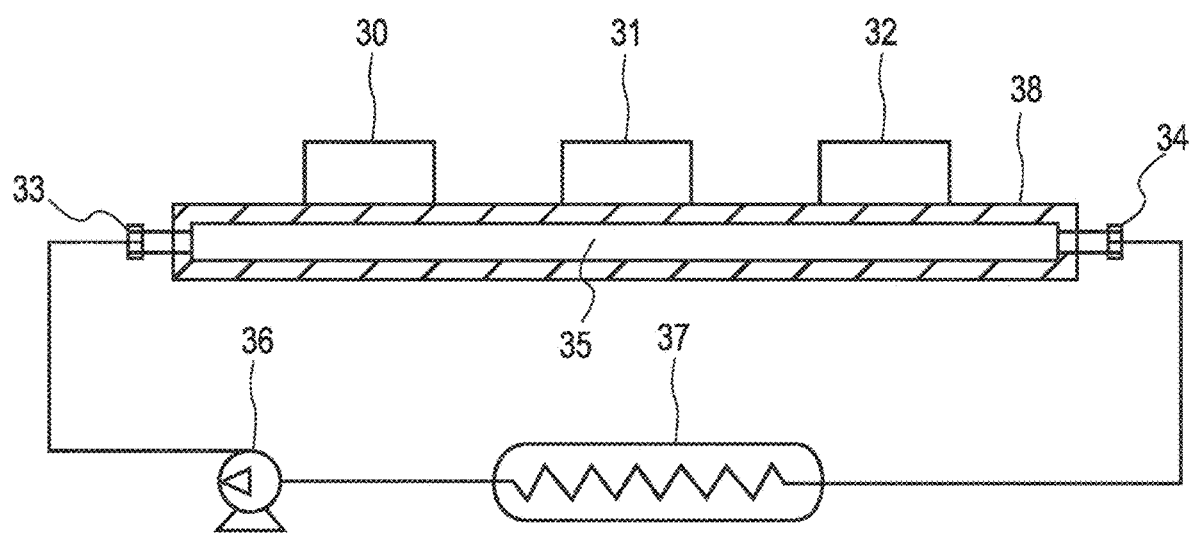
FIG. 1 is a schematic structural diagram of a water-cooling heat dissipation system in the prior art.

The reference numerals in the drawings are as follows:

| Numeral | Meaning |
| --- | --- |
| 30-32 | Power semiconductor device |
| 33 | Cooling water circuit inlet |
| 34 | Cooling water circuit outlet |
| 35 | Inner chamber |
| 36 | Pump |

-continued

| Numeral | Meaning |
| --- | --- |
| 37 | Heat exchanger |
| 38 | Cooling plate |
| 1 | Heat dissipation body |
| 2 | Fan component |
| 11 | Inner-ring substrate |
| 12 | Outer-ring substrate |
| 13 | Heat sink |
| 14 | First power semiconductor device arrangement position |
| 15 | Second power semiconductor device arrangement position |
| 21 | Fan |
| 22 | Blade |
| 23 | Fan base |
| 24 | Fixing member |
| 141 | First power semiconductor device |
| 151 | Second power semiconductor device |

DETAILED DESCRIPTION OF THE EXAMPLE EMBODIMENTS

At least one embodiment of the present invention is directed to a radiator component for a power semiconductor device, comprising:
a heat dissipation body, comprising:
an inner-ring substrate,
an outer-ring substrate, wherein the outer-ring substrate surrounds the inner-ring substrate, and
a plurality of heat sinks, arranged between the inner-ring substrate and the outer-ring substrate, wherein one or more first power semiconductor device arrangement positions are provided on an inner circumferential surface of the inner-ring substrate, and one or more second power semiconductor device arrangement positions are arranged on an outer circumferential surface of the outer-ring substrate; and
a fan component.

It can be seen that, compared with a radiator having a planar arrangement and a water-cooling heat dissipation system, the radiator component having an annular structure as provided in at least one embodiment of the present invention has a more compact structure and can significantly save space, reduce costs, and improve the cooling efficiency.

In an embodiment,
the first power semiconductor device arrangement positions are evenly arranged along the inner circumferential surface of the inner-ring substrate; and/or
the second power semiconductor device arrangement positions are evenly arranged along the outer circumferential surface of the outer-ring substrate.

In this embodiment of the present invention, the first power semiconductor device arrangement positions are evenly arranged along the inner circumferential surface of the inner-ring substrate to enable power semiconductor devices on the inner circumferential surface of the inner-ring substrate to dissipate heat evenly. Moreover, in this embodiment of the present invention, the second power semiconductor device arrangement positions are evenly arranged along the outer circumferential surface of the outer-ring substrate to enable power semiconductor devices on the outer circumferential surface of the outer-ring substrate to dissipate heat evenly.

In an embodiment, the fan component and the heat dissipation body are arranged in an axial direction of the heat dissipation body, and an air outlet surface or an air inlet surface of the fan component faces the heat dissipation body.

It can be seen that the fan component in this embodiment of the present invention has a plurality of deployment positions. The fan component may be flexibly arranged based on the specific requirements for an application spot.

In an embodiment, a main air duct of the heat dissipation body matches a flow field of the fan component.

It can be seen that the radiator component having an annular structure used in this embodiment of the present invention is better adapted to an air flow provided by the fan component, so that the heat dissipation efficiency is improved. Moreover, in this embodiment of the present invention, a single fan component can be used, and the problem of air flow disturbances between a plurality of fans is accordingly avoided.

In an embodiment, the plurality of heat sinks have a radial pattern of being arranged at equal intervals in a radial direction of the heat dissipation body.

Therefore, the heat sinks having the radial pattern of being arranged at equal intervals can achieve efficient heat dissipation and facilitate industrial manufacturing.

In an embodiment, the first power semiconductor device arrangement position has a prismatic shape or a curved shape; and/or the second power semiconductor device arrangement position has a prismatic shape or a curved shape.

Therefore, if the first power semiconductor device arrangement position and the second power semiconductor device arrangement position are provided with prismatic shapes, it becomes easy to mount power semiconductor devices which usually have planar substrates. If the first power semiconductor device arrangement position and the second power semiconductor device arrangement position are provided with curved shapes, the power semiconductor device and the inner-ring substrate or the outer-ring substrate can have closer contact, thereby improving the heat dissipation efficiency.

In an embodiment,
the inner-ring substrate is a rhombic ring, and the outer-ring substrate is a circular ring; or
the inner-ring substrate is a circular ring, and the outer-ring substrate is a rhombic ring; or
the inner-ring substrate and the outer-ring substrate are both circular rings; or
the inner-ring substrate and the outer-ring substrate are both rhombic rings; or
the inner-ring substrate is a rhombic ring, and the outer-ring substrate is an elliptical ring; or
the inner-ring substrate is an elliptical ring, and the outer-ring substrate is a rhombic ring; or
the inner-ring substrate and the outer-ring substrate are both elliptical rings; or
the inner-ring substrate is a circular ring, and the outer-ring substrate is an elliptical ring; or
the inner-ring substrate is an elliptical ring, and the outer-ring substrate is a circular ring.

It can be seen that specific shapes of the inner-ring substrate and the outer-ring substrate in this embodiment of the present invention have a plurality of implementation forms and are applicable to various types of application spots.

At least one embodiment of the invention is directed to a heat dissipation system for a power semiconductor device, comprising:
a heat dissipation body, comprising an inner-ring substrate, an outer-ring substrate, and a plurality of heat sinks, wherein the outer-ring substrate surrounds the inner-ring substrate, the plurality of heat sinks are arranged between the inner-ring substrate and the outer-ring substrate, one or more first power semiconductor device arrangement positions are provided on an inner circumferential surface of the inner-ring substrate, and one or more second power semiconductor device arrangement positions are arranged on an outer circumferential surface of the outer-ring substrate;

a fan component;

a first power semiconductor device, arranged at at least one first power semiconductor device arrangement position; and a second power semiconductor device, arranged at at least one second power semiconductor device arrangement position.

It can be seen that, compared with a radiator having a planar arrangement and a water-cooling heat dissipation system, the heat dissipation system using a radiator having an annular structure provided in the embodiments of the present invention has a more compact structure and can significantly save space, reduce costs, and improve the cooling efficiency.

In an embodiment, the first power semiconductor device comprises an IGBT, a power diode, a thyristor or a MOSFET; or the second power semiconductor device comprise an IGBT, a power diode, a thyristor or a MOSFET.

Therefore, this embodiment of the present invention is applicable to various types of power semiconductor devices and has a wide application range.

In an embodiment, the first power semiconductor device arrangement position has a prismatic shape, and the first power semiconductor device comprises a planar substrate adapted to the prismatic shape; or the first power semiconductor device arrangement position has a curved shape, and the first power semiconductor device comprises a curved substrate adapted to the curved shape; or the second power semiconductor device arrangement position has a prismatic shape, and the second power semiconductor device comprises a planar substrate adapted to the prismatic shape; or the second power semiconductor device arrangement position has a curved shape, and the second power semiconductor device comprises a curved substrate adapted to the curved shape.

Therefore, if the first power semiconductor device arrangement position and the second power semiconductor device arrangement position are provided with prismatic shapes, it becomes easy to mount power semiconductor devices which usually have planar substrates. If the first power semiconductor device arrangement position and the second power semiconductor device arrangement position are provided with curved shapes, the power semiconductor device and the inner-ring substrate or the outer-ring substrate can have closer contact, thereby improving the heat dissipation efficiency.

To make the technical solutions and advantages of the present invention more comprehensible, the present invention is further described below in detail with reference to the accompanying drawings and embodiments. It should be understood that the specific embodiments described herein are merely used to illustrate the present invention, rather than to limit the scope of protection of the present invention.

For the purpose of simple and intuitive description, several representative embodiments are used below to describe the solutions of the present invention. A lot of details in the embodiments are only used to help understand the solutions of the present invention. However, it is evident that the technical solutions of the present invention may not be limited to these details during implementation. To avoid unnecessary ambiguities in the solutions of the present invention, some embodiments are not described in detail, and only a framework is provided instead. Hereinafter, "comprise" means "comprises, but is not limited to", and "according to . . . " means "at least according to . . . , but is not limited to only being according to . . . ". Due to the conventions of the Chinese language, when a quantity is not particularly specified for a component below, it means that there may be one component or may be a plurality of components, or it may be understood that there is at least one component.

In view of the disadvantage in the prior art that a radiator structure having a planar arrangement and a water-cooling heat dissipation system are not compact, the embodiments of the present invention provide a radiator component for a power semiconductor device that has a more compact structure and a higher cooling efficiency.

Figure 2:
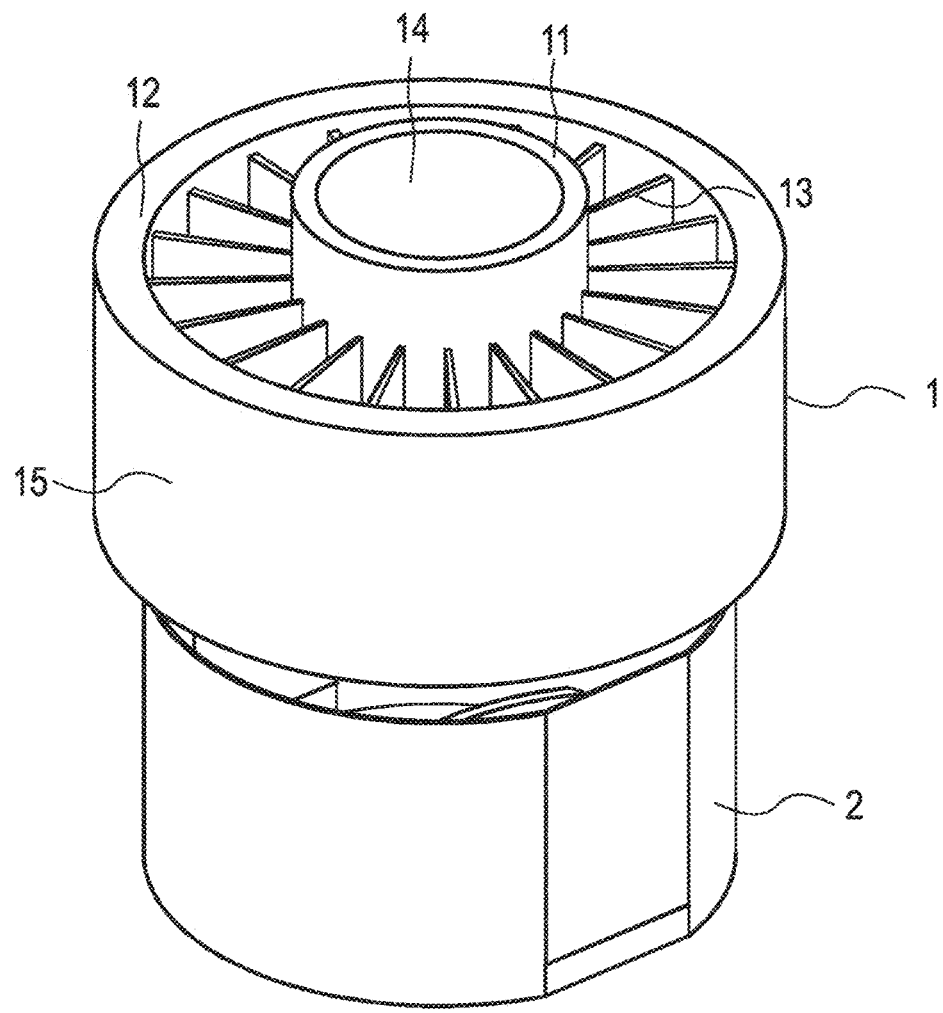
FIG. 2 is an example structural diagram of a radiator component for a power semiconductor device according to an embodiment of the present invention.

FIG. 2 is an example structural diagram of a radiator component for a power semiconductor device according to an embodiment of the present invention.

As shown in FIG. 2, the radiator component comprises:

a heat dissipation body 1; and a fan component 2, wherein the heat dissipation body 1 comprises an inner-ring substrate 11, an outer-ring substrate 12, and a plurality of heat sinks 13, wherein the outer-ring substrate 12 surrounds the inner-ring substrate 11, the plurality of heat sinks 13 are arranged between the inner-ring substrate 11 and the outer-ring substrate 12, one or more first power semiconductor device arrangement positions 14 are provided on an inner circumferential surface of the inner-ring substrate 11, and one or more second power semiconductor device arrangement positions 15 are arranged on an outer circumferential surface of the outer-ring substrate 12.

The heat dissipation body 1 forms a major part of the radiator component, and is used to carry a power semiconductor device which requires heat dissipation. The fan component 2 is used to provide an air flow for the heat dissipation body 1 to carry away heat generated by the power semiconductor device.

In an embodiment, the fan component 2 and the heat dissipation body 1 are arranged in an axial direction of the heat dissipation body 1, and an air outlet surface or an air inlet surface of the fan component 2 faces the heat dissipation body 1.

For example, as shown in FIG. 2, the fan component 2 is arranged at a lower portion of the heat dissipation body 1, and the air outlet surface faces the heat dissipation body 1, and is used to blow air from bottom to top. In an optional embodiment, the fan component 2 may further be arranged at an upper portion of the heat dissipation body 1, and the air inlet surface faces the heat dissipation body 1, and is used to suck air from bottom to top.

The inner-ring substrate 11 may be implemented with various types of annular shapes, and the outer-ring substrate 12 may be implemented with various types of annular shapes. Moreover, both the inner-ring substrate 11 and the outer-ring substrate 12 are preferably made of a metal material that has high thermal conductivity.

For example, the inner-ring substrate 11 may be implemented as a rhombic ring, and the outer-ring substrate 12 may be implemented as a circular ring. Alternatively, the inner-ring substrate 11 may be implemented as circular ring, and the outer-ring substrate 12 may be implemented as a rhombic ring. Alternatively, the inner-ring substrate 11 and the outer-ring substrate 12 may both be implemented as circular rings. Alternatively, the inner-ring substrate 11 and the outer-ring substrate 12 may both be implemented as rhombic rings. Alternatively, the inner-ring substrate 11 may be implemented as a rhombic ring, and the outer-ring substrate 12 may be implemented as an elliptical ring. Alternatively, the inner-ring substrate 11 may be implemented as elliptical ring, and the outer-ring substrate 12 may be implemented as a rhombic ring. Alternatively, the inner-ring substrate 11 and the outer-ring substrate 12 may both be implemented as elliptical rings. Alternatively, the inner-ring substrate 11 may be implemented as circular ring, and the outer-ring substrate 12 may be implemented as an elliptical ring. Alternatively, the inner-ring substrate 11 may be implemented as elliptical ring, and the outer-ring substrate 12 may be implemented as a circular ring.

The specific types of the inner-ring substrate 11 and the outer-ring substrate 12 are exemplarily described above. A person skilled in the art should be aware that such description is merely example, and is not used to limit the scope of protection of this embodiment of the present invention.

One or more first power semiconductor device arrangement positions 14 used for arranging power semiconductors are provided on the inner circumferential surface of the inner-ring substrate 11. A power semiconductor device which requires heat dissipation may be fixedly arranged at the first power semiconductor device arrangement position 14 by means of a bonding or threading method. For example, one power semiconductor is correspondingly arranged at one first power semiconductor device arrangement position 14. The first power semiconductor device arrangement position 14 may be implemented with a prismatic shape or a curved shape. When the first power semiconductor device arrangement position 14 is implemented with a prismatic shape, the power semiconductor device arranged at the first power semiconductor device arrangement position 14 comprises a planar substrate adapted to the prismatic shape. When the first power semiconductor device arrangement position 14 is implemented with a curved shape, the power semiconductor device arranged at the first power semiconductor device arrangement position 14 comprises a curved substrate adapted to the prismatic shape.

Similarly, one or more second power semiconductor device arrangement positions 15 used for arranging power semiconductors are provided on the outer circumferential surface of the outer-ring substrate 12. A power semiconductor device which requires heat dissipation may be fixedly arranged at the second power semiconductor device arrangement position 15 in a bonded or threaded manner. For example, one power semiconductor is correspondingly arranged at one second power semiconductor device arrangement position 15. The second power semiconductor device arrangement position 15 may be implemented with a prismatic shape or a curved shape. When the second power semiconductor device arrangement position 15 is implemented with a prismatic shape, the power semiconductor device arranged at the second power semiconductor device arrangement position 15 comprises a planar substrate adapted to the prismatic shape. When the second power semiconductor device arrangement position 15 is implemented with a curved shape, the power semiconductor device arranged at the second power semiconductor device arrangement position 15 comprises a curved substrate adapted to the prismatic shape.

The plurality of heat sinks 13 are provided between the inner-ring substrate 11 and the outer-ring substrate 12. Preferably, the heat sinks 13 have a radial pattern of being arranged at equal intervals in a radial direction of the heat dissipation body 1. Two ends of each heat sink 13 are in contact with the inner-ring substrate 11 and the outer-ring substrate 12 respectively. For example, the heat sink 13 may be implemented as a heat sink fin or a cooling fin.

Heat generated by the power semiconductor device arranged at the first power semiconductor device arrangement position 14 undergoes a temperature balancing effect of the inner-ring substrate 11 and is then transferred to the heat sinks 13. Heat generated by the power semiconductor device arranged at the second power semiconductor device arrangement position 15 undergoes a temperature balancing effect of the outer-ring substrate 12 and is then transferred to the heat sinks 13. Next, the air flow provided by the fan component 2 reduces the temperature of the heat sinks 13, so as to perform heat dissipation for the power semiconductor devices arranged at the first power semiconductor device arrangement position 14 and the second power semiconductor device arrangement position 15 to reduce the temperature of the power semiconductor devices.

It can be seen that, compared with a radiator having a planar arrangement and a water-cooling heat dissipation system, the radiator component having an annular structure provided in this embodiment of the present invention has a more compact structure and can significantly save space. Moreover, the annular radiator component in this embodiment of the present invention can perform heat dissipation for both a power semiconductor device on the outer circumferential surface of the outer-ring substrate 12 and a power semiconductor device on the inner circumferential surface of the inner-ring substrate 11, thereby improving the heat dissipation efficiency.

In addition, because the radiator component having an annular structure is better adapted to an air flow provided by a fan component, one fan component can be used, and the problem of air flow disturbances between a plurality of fans is accordingly avoided.

Based on the foregoing description, various types of fan components may be used in this embodiment of the present invention.

Figure 3:
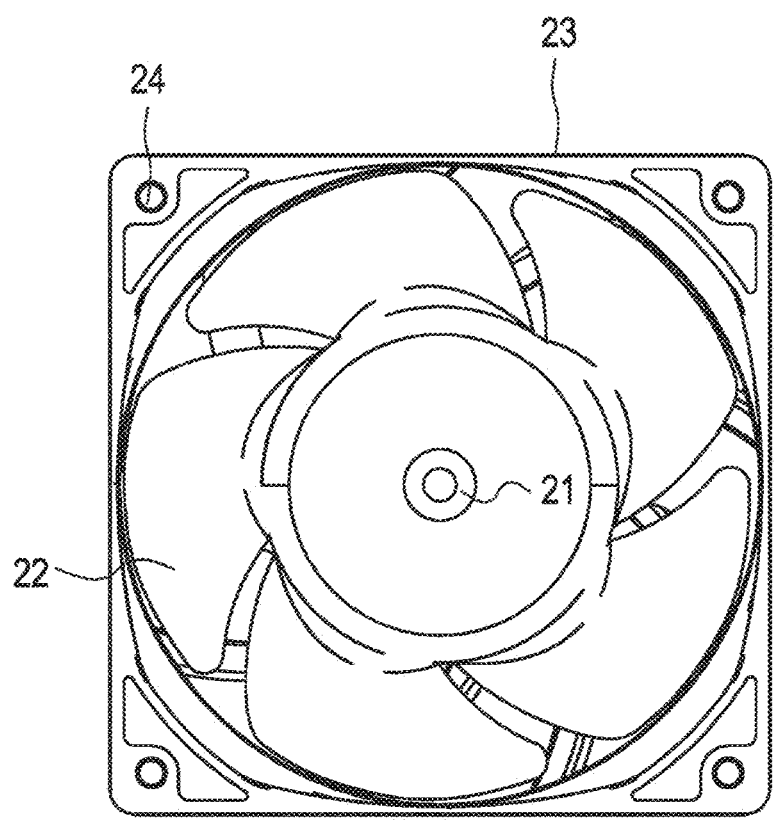
FIG. 3 is an example structural diagram of a fan component according to an embodiment of the present invention.

FIG. 3 is an example structural diagram of a fan component according to an embodiment of the present invention.

In FIG. 2, the fan component comprises:
a fan 21;
a blade 22, wherein a plurality of blades 22 may be provided; and
a fan base 23, which is used to accommodate the fan 21 and the blade 22.

In an embodiment, the fan component may further comprise a fixing member 24, which is used to assemble the fan component and the heat dissipation body 1 in FIG. 1 into a whole. Preferably, a main air duct of the heat dissipation body 1 matches a flow field of the fan component 21.

Based on the foregoing description, an embodiment of the present invention further provides a heat dissipation system for a power semiconductor device.

Figure 4:
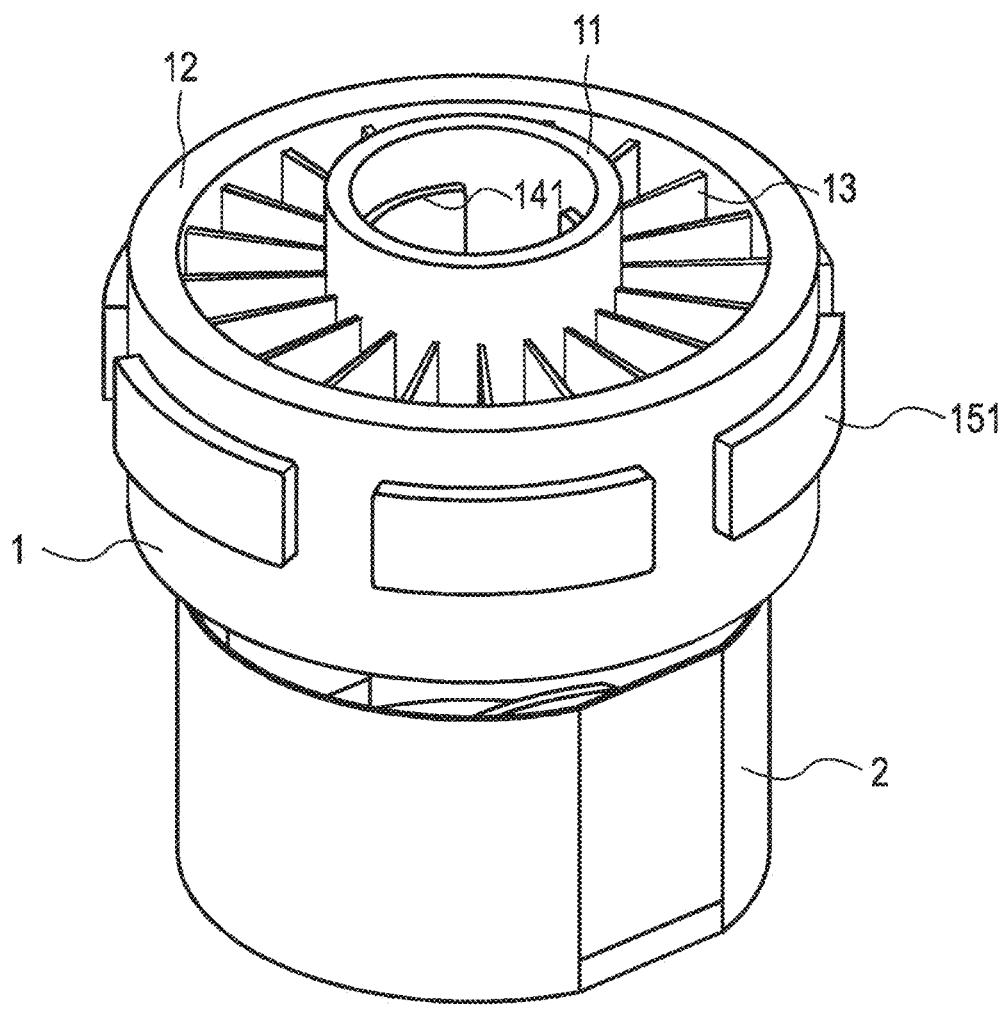
FIG. 4 is an example structural diagram of a heat dissipation system for a power semiconductor device according to an embodiment of the present invention.

FIG. 4 is an example structural diagram of a heat dissipation system for a power semiconductor device according to an embodiment of the present invention.

As shown in FIG. 4, the system comprises:
a heat dissipation body 1, comprising an inner-ring substrate 11, an outer-ring substrate 12, and a plurality of heat sinks 13, wherein the outer-ring substrate 12 surrounds the inner-ring substrate 11, the plurality of heat sinks 13 are arranged between the inner-ring substrate 11 and the outer-ring substrate 12, one or more first power semiconductor device arrangement positions are provided on an inner circumferential surface of the inner-ring substrate 11, and one or more second power semiconductor device arrangement positions are arranged on an outer circumferential surface of the outer-ring substrate 12;

a fan component 2;

a plurality of first power semiconductor devices 141, respectively arranged at corresponding first power semiconductor device arrangement positions; and a plurality of second power semiconductor devices 151, respectively arranged at corresponding second power semiconductor device arrangement positions.

The first power semiconductor device arrangement position and the second power semiconductor device arrangement position both have curved shapes. Therefore, the first power semiconductor devices 141 and the second power semiconductor devices 151 respectively comprise curved substrates adapted to the prismatic shapes.

Heat generated by the first power semiconductor devices 141 arranged at the first power semiconductor device arrangement positions undergoes a temperature balancing effect of the inner-ring substrate 11 and is then transferred to the heat sinks 13. Heat generated by the second power semiconductor devices 151 arranged at the second power semiconductor device arrangement positions 15 undergoes a temperature balancing effect of the outer-ring substrate 12 and is then transferred to the heat sinks 13. Next, an air flow provided by the fan component 2 reduces the temperature of the heat sinks 13, so as to perform heat dissipation for the first power semiconductor devices 141 and the second power semiconductor devices 151.

Preferably, the first power semiconductor devices 141 and the second power semiconductor devices 151 may be respectively implemented as IGBTs, power diodes, thyristors, MOSFETs or the like.

Typical examples of the first power semiconductor devices 141 and the second power semiconductor devices 151 are exemplarily described above. A person skilled in the art should be aware that such description is merely example, and is not used to limit the scope of protection of this embodiment of the present invention.

In conclusion, in this embodiment of the present invention, the radiator component for a power semiconductor device comprises the heat dissipation body 1 and the fan component 2. The heat dissipation body comprises the inner-ring substrate 11, the outer-ring substrate 12, and the plurality of heat sinks 13. The outer-ring substrate 12 surrounds the inner-ring substrate 11. The plurality of heat sinks 13 are arranged between the inner-ring substrate 11 and the outer-ring substrate 12. One or more first power semiconductor device arrangement positions 14 are provided on an inner circumferential surface of the inner-ring substrate 11, and one or more second power semiconductor device arrangement positions 15 are arranged on an outer circumferential surface of the outer-ring substrate 12. It can be seen that, compared with a radiator having a planar arrangement and a water-cooling heat dissipation system, the radiator component having an annular structure provided in this embodiment of the present invention has a more compact structure, can significantly save space and reduce costs, and can further improve the heat dissipation efficiency.

Moreover, because the radiator component having an annular structure is better adapted to an air flow provided by the fan component, one fan component can be used, and the problem of air flow disturbances between a plurality of fans is accordingly avoided.

The foregoing descriptions are merely preferred embodiments of the present invention, and are not used to limit the scope of protection of the present invention. Therefore, any modifications, equivalent replacements and improvements made within the spirit and principle of the present invention shall fall within the scope of protection of the present invention.

The invention claimed is:

1. A radiator component for a power semiconductor device, comprising:
    a heat dissipation body, including
        an inner-ring substrate,
        an outer-ring substrate, wherein the outer-ring substrate surrounds the inner-ring substrate, and
        a plurality of heat sinks, the plurality of heat sinks being arranged between the inner-ring substrate and the outer-ring substrate,
        wherein one or more first power semiconductor device arrangement positions are arranged on an inner circumferential surface of the inner-ring substrate, and one or more second power semiconductor device arrangement positions are arranged on an outer circumferential surface of the outer-ring substrate; and
    a fan component.

2. The radiator component for a power semiconductor device of claim 1, wherein at least one of
    the first power semiconductor device arrangement positions are evenly arranged along the inner circumferential surface of the inner-ring substrate; and
    the second power semiconductor device arrangement positions are evenly arranged along the outer circumferential surface of the outer-ring substrate.

3. The radiator component for a power semiconductor device of claim 2, wherein
    the inner-ring substrate is a rhombic ring, and the outer-ring substrate is a circular ring; or
    the inner-ring substrate is a circular ring, and the outer-ring substrate is a rhombic ring; or
    the inner-ring substrate and the outer-ring substrate are both circular rings; or
    the inner-ring substrate and the outer-ring substrate are both rhombic rings; or
    the inner-ring substrate is a rhombic ring, and the outer-ring substrate is an elliptical ring; or
    the inner-ring substrate is an elliptical ring, and the outer-ring substrate is a rhombic ring; or
    the inner-ring substrate and the outer-ring substrate are both elliptical rings; or
    the inner-ring substrate is a circular ring, and the outer-ring substrate is an elliptical ring; or
    the inner-ring substrate is an elliptical ring, and the outer-ring substrate is a circular ring.

4. The radiator component for a power semiconductor device of claim 1, wherein the fan component and the heat dissipation body are arranged in an axial direction of the heat dissipation body, and wherein an air outlet surface or an air inlet surface of the fan component faces the heat dissipation body.

5. The radiator component for a power semiconductor device of claim 4, wherein
    the inner-ring substrate is a rhombic ring, and the outer-ring substrate is a circular ring; or
    the inner-ring substrate is a circular ring, and the outer-ring substrate is a rhombic ring; or
    the inner-ring substrate and the outer-ring substrate are both circular rings; or the inner-ring substrate and the outer-ring substrate are both rhombic rings; or the inner-ring substrate is a rhombic ring, and the outer-ring substrate is an elliptical ring; or the inner-ring substrate is an elliptical ring, and the outer-ring substrate is a rhombic ring; or the inner-ring substrate and the outer-ring substrate are both elliptical rings; or the inner-ring substrate is a circular ring, and the outer-ring substrate is an elliptical ring; or the inner-ring substrate is an elliptical ring, and the outer-ring substrate is a circular ring.

6. The radiator component for a power semiconductor device of claim 1, wherein a main air duct of the heat dissipation body matches a flow field of the fan component.

7. The radiator component for a power semiconductor device of claim 6, wherein the inner-ring substrate is a rhombic ring, and the outer-ring substrate is a circular ring; or the inner-ring substrate is a circular ring, and the outer-ring substrate is a rhombic ring; or the inner-ring substrate and the outer-ring substrate are both circular rings; or the inner-ring substrate and the outer-ring substrate are both rhombic rings; or the inner-ring substrate is a rhombic ring, and the outer-ring substrate is an elliptical ring; or the inner-ring substrate is an elliptical ring, and the outer-ring substrate is a rhombic ring; or the inner-ring substrate and the outer-ring substrate are both elliptical rings; or the inner-ring substrate is a circular ring, and the outer-ring substrate is an elliptical ring; or the inner-ring substrate is an elliptical ring, and the outer-ring substrate is a circular ring.

8. The radiator component for a power semiconductor device of claim 1, wherein the plurality of heat sinks include a plurality of respective radial patterns, the respective radial patterns being arranged at equal intervals in a radial direction of the heat dissipation body.

9. The radiator component for a power semiconductor device of claim 8, wherein the inner-ring substrate is a rhombic ring, and the outer-ring substrate is a circular ring; or the inner-ring substrate is a circular ring, and the outer-ring substrate is a rhombic ring; or the inner-ring substrate and the outer-ring substrate are both circular rings; or the inner-ring substrate and the outer-ring substrate are both rhombic rings; or the inner-ring substrate is a rhombic ring, and the outer-ring substrate is an elliptical ring; or the inner-ring substrate is an elliptical ring, and the outer-ring substrate is a rhombic ring; or the inner-ring substrate and the outer-ring substrate are both elliptical rings; or the inner-ring substrate is a circular ring, and the outer-ring substrate is an elliptical ring; or the inner-ring substrate is an elliptical ring, and the outer-ring substrate is a circular ring.

10. The radiator component for a power semiconductor device of claim 1, wherein at least one of the first power semiconductor device arrangement position includes a prismatic shape or a curved shape; and the second power semiconductor device arrangement position includes a prismatic shape or a curved shape.

11. The radiator component for a power semiconductor device of claim 10, wherein the inner-ring substrate is a rhombic ring, and the outer-ring substrate is a circular ring; or the inner-ring substrate is a circular ring, and the outer-ring substrate is a rhombic ring; or the inner-ring substrate and the outer-ring substrate are both circular rings; or the inner-ring substrate and the outer-ring substrate are both rhombic rings; or the inner-ring substrate is a rhombic ring, and the outer-ring substrate is an elliptical ring; or the inner-ring substrate is an elliptical ring, and the outer-ring substrate is a rhombic ring; or the inner-ring substrate and the outer-ring substrate are both elliptical rings; or the inner-ring substrate is a circular ring, and the outer-ring substrate is an elliptical ring; or the inner-ring substrate is an elliptical ring, and the outer-ring substrate is a circular ring.

12. The radiator component for a power semiconductor device of claim 1, wherein the inner-ring substrate is a rhombic ring, and the outer-ring substrate is a circular ring; or the inner-ring substrate is a circular ring, and the outer-ring substrate is a rhombic ring; or the inner-ring substrate and the outer-ring substrate are both circular rings; or the inner-ring substrate and the outer-ring substrate are both rhombic rings; or the inner-ring substrate is a rhombic ring, and the outer-ring substrate is an elliptical ring; or the inner-ring substrate is an elliptical ring, and the outer-ring substrate is a rhombic ring; or the inner-ring substrate and the outer-ring substrate are both elliptical rings; or the inner-ring substrate is a circular ring, and the outer-ring substrate is an elliptical ring; or the inner-ring substrate is an elliptical ring, and the outer-ring substrate is a circular ring.

13. A heat dissipation system for a power semiconductor device, comprising:

a heat dissipation body, including an inner-ring substrate, an outer-ring substrate, and a plurality of heat sinks, the outer-ring substrate surrounding the inner-ring substrate, the plurality of heat sinks being arranged between the inner-ring substrate and the outer-ring substrate, wherein one or more first power semiconductor device arrangement positions are provided on an inner circumferential surface of the inner-ring substrate, and one or more second power semiconductor device arrangement positions are arranged on an outer circumferential surface of the outer-ring substrate;

a fan component;

a first power semiconductor device, arranged at at least one of the one or more first power semiconductor device arrangement positions; and a second power semiconductor device, arranged at at least one of the one or more second power semiconductor device arrangement positions.

14. The heat dissipation system for a power semiconductor device of claim 13, wherein the first power semiconductor device includes an insulated-gate bipolar transistor, a power diode, a metal-oxide semiconductor field-effect transistor or a thyristor; or the second power semiconductor device includes an insulated-gate bipolar transistor, a power diode, a metal-oxide semiconductor field-effect transistor or a thyristor.

15. The heat dissipation system for a power semiconductor device of as claimed in claim 13, wherein the first power semiconductor device arrangement position includes a prismatic shape, and the first power semiconductor device includes planar substrate adapted to the prismatic shape; or the first power semiconductor device arrangement position includes curved shape, and the first power semiconductor device includes a curved substrate adapted to the curved shape; or the second power semiconductor device arrangement position includes a prismatic shape, and the second power semiconductor device includes a planar substrate adapted to the prismatic shape; or the second power semiconductor device arrangement position includes a curved shape, and the second power semiconductor device includes a curved substrate adapted to the curved shape.

* * * * *